United States Patent
Feng (10) Patent No.: US 11,322,525 B2
(45) Date of Patent: May 3, 2022

(54) ARRAY SUBSTRATE AND DISPLAY PANEL HAVING ORGANIC INSULATING ELASTIC LAYER DISPOSED ON BENDING PATHWAY

(71) Applicant: WUHAN CHINA STAR OPTOELECTRONICS SEMICONDUCTOR DISPLAY TECHNOLOGY CO., LTD., Wuhan (CN)

(72) Inventor: Xiaoliang Feng, Wuhan (CN)

( * ) Notice: Subject to any disclaimer, the term of this patent is extended or adjusted under 35 U.S.C. 154(b) by 519 days.

(21) Appl. No.: 16/467,044

(22) PCT Filed: Mar. 12, 2019

(86) PCT No.: PCT/CN2019/077881
§ 371 (c)(1),
(2) Date: Jun. 6, 2019

(87) PCT Pub. No.: WO2020/118931
PCT Pub. Date: Jun. 18, 2020

(65) Prior Publication Data
US 2021/0384230 A1    Dec. 9, 2021

(30) Foreign Application Priority Data

Dec. 13, 2018  (CN) .......................... 201811524188.4

(51) Int. Cl.
*H01L 27/12* (2006.01)

(52) U.S. Cl.
CPC ...... *H01L 27/1244* (2013.01); *H01L 27/1218* (2013.01)

(58) Field of Classification Search
CPC .................. H01L 27/1244; H01L 27/1218
USPC .......................................................... 257/72
See application file for complete search history.

(56) References Cited

U.S. PATENT DOCUMENTS

| | | | |
|---|---|---|---|
| 2014/0132553 A1* | 5/2014 | Park | G06F 3/0445 345/174 |
| 2015/0099954 A1* | 4/2015 | Achmann | A61B 5/1468 600/345 |
| 2016/0035812 A1* | 2/2016 | Kwon | H01L 29/66757 257/40 |
| 2016/0363795 A1 | 12/2016 | Jeon et al. | |
| 2016/0370827 A1* | 12/2016 | Jin | G06F 1/1626 |
| 2018/0059862 A1 | 3/2018 | Zeng et al. | |
| 2019/0004569 A1 | 1/2019 | Jin et al. | |
| 2019/0287433 A1 | 9/2019 | Huang et al. | |

FOREIGN PATENT DOCUMENTS

| | | | |
|---|---|---|---|
| CN | 102855821 A | 1/2013 |
| CN | 106951125 A | 7/2017 |
| CN | 106972030 A | 7/2017 |
| CN | 107017265 A | 8/2017 |
| CN | 207781091 U | 8/2018 |
| CN | 108598142 A | 9/2018 |
| CN | 109410764 A | 3/2019 |
| KR | 20140050453 A | 4/2014 |

\* cited by examiner

*Primary Examiner* — Duy T Nguyen (57) ABSTRACT

An array substrate and a display panel are provided. The array substrate includes a flexible substrate, a peripheral trace, and a bending pathway. The array substrate is folded along the bending pathway so that the peripheral trace is located on the back side of a display zone to increase an area of the display zone of a displaying screen.

17 Claims, 7 Drawing Sheets

ARRAY SUBSTRATE AND DISPLAY PANEL HAVING ORGANIC INSULATING ELASTIC LAYER DISPOSED ON BENDING PATHWAY

FIELD OF INVENTION

The present invention relates to a technical field of displays, and in particular, to an array substrate and a display panel.

BACKGROUND OF INVENTION

With the release of new products from IPHONE X and SAMSUNG, narrow bezels and U-Cut (a top screen groove design) full-screen products become hot on the market, and full-screens have gradually become the mainstream of the industry.

Full-screens increase the screen ratio by reducing an invalid area, enhancing the consumers' visual experience. However, the so-called full-screen of the conventional technology is still in the category of narrow bezel technology, and cannot be a full-screen in the true sense. One of the main limiting factors from a narrow bezel to a full-screen is that borders of display panels require an area for a peripheral trace that occupies a display screen of the display panel.

SUMMARY OF INVENTION

An object of the present application is to provide an array substrate and a display panel, wherein an area of a display zone in the array substrate and the display panel thereof is increased.

An array substrate includes a flexible substrate comprising a first surface and a second surface opposite to the first surface, the first surface of the flexible substrate includes a display zone and a non-display zone, and the non-display zone is located at a periphery of the display zone; a peripheral trace disposed on a trace segment of the non-display zone; a bending pathway disposed between the trace segment and the display zone; the array substrate is folded along the bending pathway and the peripheral trace is located at a side of the second surface of the flexible substrate.

In one embodiment of the present invention, the array substrate further includes a transition trace disposed on a line transition segment, and the line transition segment is located between the bending pathway and the display zone.

In one embodiment of the present invention, the transition trace includes a first conductive layer, a first insulation layer, and a second conductive layer which are sequentially disposed on the first surface of the flexible substrate.

In one embodiment of the present invention, the array substrate further includes a gate driving circuitry disposed on the trace segment, and the array substrate is folded along the bending pathway to have the gate driving circuitry located at the side of the second surface of the flexible substrate.

In one embodiment of the present invention, the second conductive layer is electrically connected to the gate driving circuitry and the first conductive layer through at least one through via in the first insulation layer.

In one embodiment of the present invention, the first conductive layer is a scan line extending from the display zone to the line transition segment.

In one embodiment of the present invention, a width of the line transition segment is in a range of 0.08 mm to 0.12 mm.

In one embodiment of the present invention, the width of the line transition segment is 0.1 mm.

In one embodiment of the present invention, the array substrate further includes an organic insulating elastic layer disposed on the bending pathway.

In one embodiment of the present invention, an organic insulating elastic protrusion is disposed on a contact surface between the organic insulating elastic layer and the peripheral trace.

In one embodiment of the present invention, the organic insulating elastic protrusion has a hemispherical, trapezoid, stepped, or toothed shape.

In one embodiment of the present invention, the array substrate further includes at least one conductive pad disposed on the peripheral trace on both sides of the bending pathway.

In one embodiment of the present invention, the conductive pad is an organic conductive pad.

In one embodiment of the present invention, a width of the conductive pad along a direction perpendicular to the longitudinal axis of the peripheral trace is 2-10 times of a width of the peripheral trace.

In one embodiment of the present invention, the array substrate further includes an external control chip bonded on the bonding area of the trace segment, and the array substrate is folded along the bending pathway to have the external control chip located at the side of the second surface of the flexible substrate.

In one embodiment of the present invention, the bending pathway is arranged in a shape of a meshed grid.

A display panel including an array substrate, in which the array substrate includes a flexible substrate including a first surface and a second surface opposite to the first surface, the first surface of the flexible substrate includes a display zone and a non-display zone, the non-display zone is located at a periphery of the display zone; a peripheral trace disposed on a trace segment of the non-display zone; a bending pathway disposed between the trace segment and the display zone; the array substrate is folded along the bending pathway and the peripheral trace is located at a side of the second surface of the flexible substrate.

In one embodiment of the present invention, the array substrate further includes a gate driving circuitry disposed on the trace segment, and the array substrate is folded along the bending pathway to have the gate driving circuitry located at the side of the second surface of the flexible substrate.

In one embodiment of the present invention, the array substrate further includes an external control chip bonded on the bonding area of the trace segment, and the array substrate is folded along the bending pathway to have the external control chip located at the side of the second surface of the flexible substrate.

In one embodiment of the present invention, the array substrate further includes an organic insulating elastic layer disposed on the bending pathway.

The present application provides an array substrate and a display panel, and the peripheral trace is located on the back side of the display zone by folding the array substrate along the bending pathway to increase the area of the display zone in the displaying screen.

LEGENDS IN THE FIGURES 100 flexible substrate, 102 first surface, 104 second surface, 102a display zone, 102a' non-display zone, 103 bonding area, 1021 first corner, 1022 second corner, 1023 third corner, 1024 fourth corner, 1025 first main trace segment, 1026 second main trace segment, 1027 third main trace segment, 1028 fourth main trace segment, 110 peripheral trace, 120a bending pathway, 120 organic insulating elastic layer, 121 organic insulating elastic protrusion, 130 data line, 140 scan line, 150 gate driving circuitry, 160 transition trace, 160a line transition segment, 170 conductive pad, 11 first conductive layer, 12 first insulation layer, 13 second conductive layer, 14 second insulation layer, 15 first transition pad, and 16 second transition pad.

DETAILED DESCRIPTION OF PREFERRED EMBODIMENTS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure. For the skilled persons of ordinary skill in the art without creative effort, the other embodiments obtained thereby are still covered by the present invention.

Figure 1:
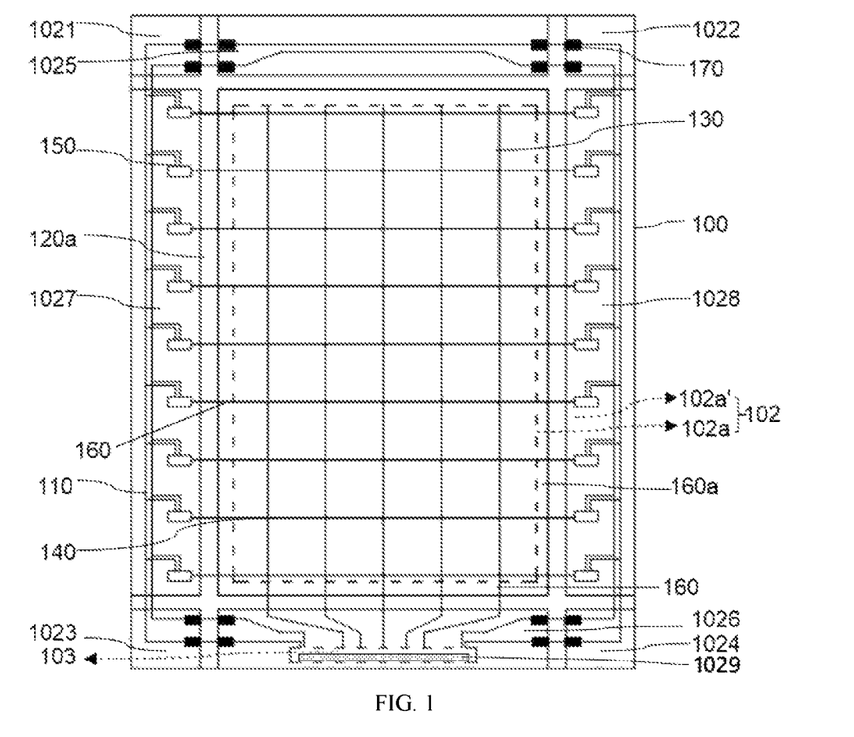
FIG. 1 is a schematic view of an array substrate before folding according to an embodiment of the present application.
Figure 2:
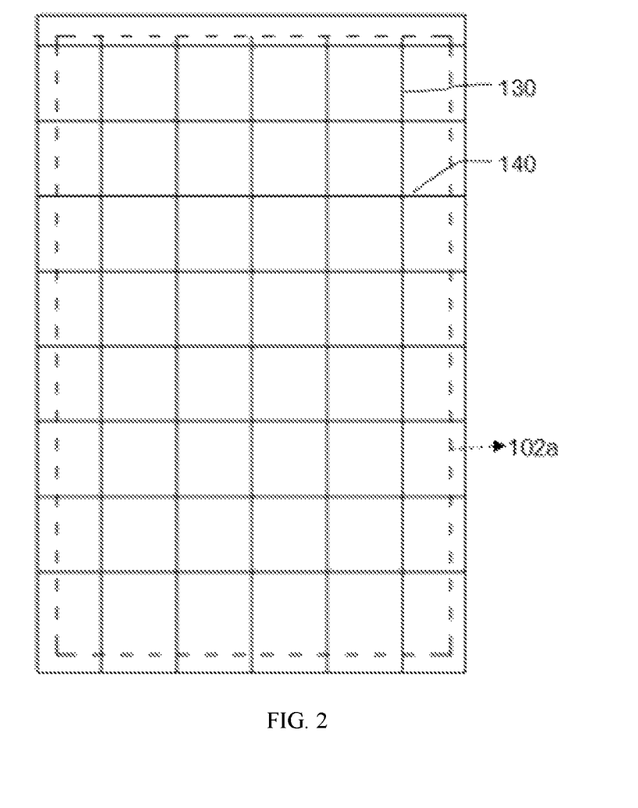
FIG. 2 is a schematic view of the array substrate of FIG. 1 after being folded.
Figure 3:
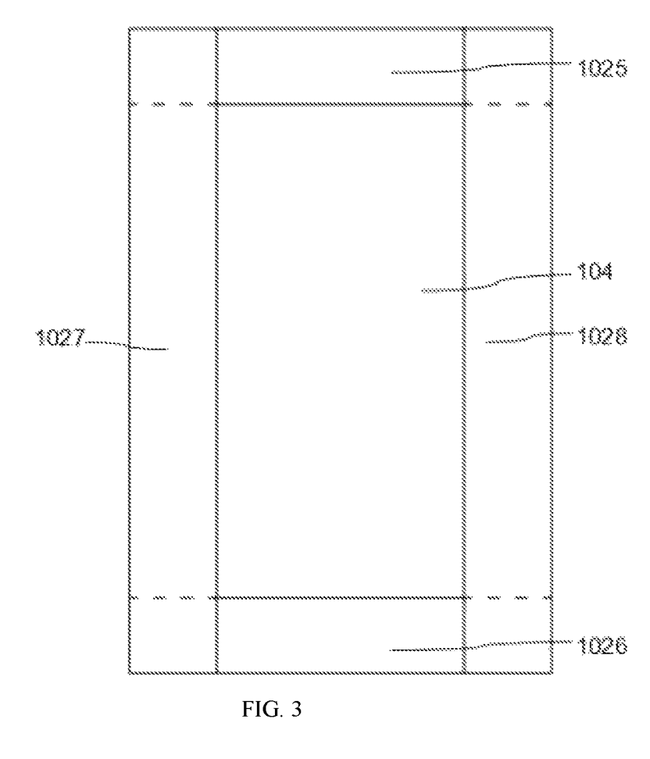
FIG. 3 is a schematic view of the back side of the array substrate shown in FIG. 2.

Referring to FIG. 1, FIG. 2, and FIG. 3, FIG. 1 is an array substrate according to an embodiment of the present application, FIG. 2 is a schematic view of the array substrate of FIG. 1 after being folded, and FIG. 3 is a schematic view of the back side of the array substrate shown in FIG. 2. The array substrate shown in FIG. 1 includes a flexible substrate 100 including a first surface 102 and a second surface 104 opposite to the first surface 102, wherein the first surface 102 of the flexible substrate 100 includes a display zone 102a and a non-display zone 102a', and the non-display zone 102a' is located at a periphery of the display zone; a peripheral trace 110 disposed on a trace segment of the non-display zone 102a'; a bending pathway 120a disposed between the trace segment and the display zone 102a; wherein the array substrate is folded along the bending pathway 120a and the peripheral trace 110 is located at a side of the second surface 104 of the flexible substrate 100.

The aforementioned array substrate is folded along the bending pathway so that the peripheral trace is located on the back side of the display zone to increase the area of the display zone of the displaying screen.

In this embodiment, the array substrate is a thin film transistor array substrate, and the substrate is a flexible substrate 100 to make the array substrate to have foldability. The flexible substrate 100 can be made of polyimide (PI), polyethylene terephthalate (PET) or other flexible materials.

The first surface 102 of the flexible substrate 100 has a display zone 102a and a non-display zone 102a', and the display zone 102a is provided with a plurality of data lines 130 and a plurality of scan lines 140 that intersect each other perpendicularly. A plurality of thin film transistors (not shown) are disposed in a region where the plurality of data lines 130 and the plurality of scan lines 140 are intersected, each of the scan lines 140 is connected to the gate of the thin film transistor to input a scan signal to the thin film transistor, and each of the data lines 130 is connected to a source of the thin film transistor to input a data signal to the thin film transistor. Manufacturing the thin film transistor in the display zone 102a includes the following steps:

forming a first conductive layer on the first surface 102 of the flexible substrate 100, patterning the first conductive layer in the display zone 102a to form a plurality of gates;

forming a first insulation layer on of the first surface 102;

forming a patterned channel layer on the first surface 102;

forming a second insulation layer on the first surface 102 and patterning the second insulation layer in the display zone 102a to form at least one through via on the second insulation layer;

forming a second conductive layer on the first surface 102 and patterning the second conductive layer in the display zone 102a to form a plurality of source/drain electrodes, and the source/drain electrodes are electrically connected to the patterned channel layer by the through via on the second insulation layer.

It should be noted that, in the process of forming a thin film transistor in the display zone 102a, a first conductive layer, a first insulation layer, a second conductive layer, and a second insulation layer are sequentially formed in the non-display zone 102a' at the same time to form other lines in the non-display zone 102a'.

The peripheral trace 110 is disposed in the trace segment of the non-display zone 102a', and the peripheral trace 110 is disposed around the display zone 102a. The peripheral trace includes, but is not limited to, a power supply voltage (voltage drain-drain, VDD) trace, a ground voltage (voltage source-source, VSS) trace, a clock (CLK) trace, an external clock (XCLK) trace. The VDD trace, the VSS trace, the CLK trace, and the XCLK trace are formed by patterning the second conductive layer in the non-display zone 102a', that is, the second conductive layer is the conductive layer forming a source/drain electrode of the thin film transistor in the display zone 102a.

The bending pathway 120a is located at the periphery of the display zone 102a, and the bending pathway is arranged in a shape of a meshed grid. In other embodiments, the bending pathway may also be other structures, for example, the bending pathway is a stripe and is respectively located on at least one side of the array substrate. The peripheral traces 110 located in the trace segment of the non-display area 102a' are disposed on the second surface 104 of the flexible substrate 100 along the meshed grid folding channel. That is, on the first surface 102 of the flexible substrate 100 (the surface of the displaying screen of the array substrate) only has the display zone 102a, and the front view of the array substrate after being folded along the bending pathway 120a is as shown in FIG. 2, and the back side of the array substrate after being folded along the bending pathway 120a is as shown in FIG. 3.

For the non-display zone 102a', the meshed grid shape bending pathway 120a divides it into 8 regions, including a first corner 1021, a second corner 1022, a third corner 1023, a fourth corner 1024, a first main trace segment 1025 located between the first corner 1021 and the second corner 1022, a second main trace segment 1026 located between the third corner 1023 and the fourth corner 1024, a third main trace segment 1027 located between the first corner 1021 and the third corner 1023, and a fourth main trace segment 1028 located between the second corner 1022 and the fourth corner 1024.

Further, the array substrate further includes a gate driving circuitry 150, ex. a gate on array (GOA). The gate driving circuitry 150 is disposed in the trace segment, and is folded along the bending pathway 120a such that the gate driving circuitry 150 is located on the side of the second surface 104 of the flexible substrate 100. Specifically, the gate driving circuitry 150 is disposed in the third main trace segment 1027 and the fourth main trace segment 1028, and the two ends of each scan line 140 in the display zone 102a are respectively connected to the gate driving circuitry 150, that is, each scan line 140 is input the scan/driving signal through both ends. In other embodiments, the gate driving circuitry 150 can also be disposed in the third main trace segment 1027 or the fourth main trace segment 1028, that is, each scan line 140 inputs a driving signal through one end. In addition, the gate driving circuitry 150 is electrically connected to the peripheral trace 110. The gate driving circuitry 150 is fabricated in the same layer as the scan line 140 of the thin film transistor in the display zone 102a.

Referring to FIG. 1, the array substrate further includes an external control chip 1029, and the external control chip 1029 is bound to the bonding area 103 of the trace segment, and the array substrate is folded along the bending pathway 120a so that the external control chip 1029 is located at the second surface 104 of the flexible substrate 100. The external control chip 1029 includes a data driving control chip for outputting a driving signal to the data line and a chip for inputting a control signal to the peripheral trace 110, and the data line 130 and the peripheral trace 110 are extended to the bonding area 103 and are electrically connected to the external control chip 1029 through a flexible printed circuit (FPC). Specifically, the external control chip 1029 bound to the bonding area 103 is located in the second main trace segment 1026.

In order to prevent the critical lines (including the scan line and the data line, etc.) in the display zone 102a extending into the bending pathway 120a from being broken during the folding process of the array substrate, the array substrate further includes a transition trace 160. The transition trace 160 is disposed in the line transition segment 160a, the line transition segment 160a is located between the bending pathway 120a and the display zone 102a. The line transition segment 160a has a width in a range about from 0.08 mm to 0.12 mm, for example, the line transition segment 160a has a width of 0.1 mm. Even if the transition trace 160 is added to the first surface 102a of the flexible substrate 100, the displaying area occupied the display zone 102a is still as high as 99%.

Figure 4:
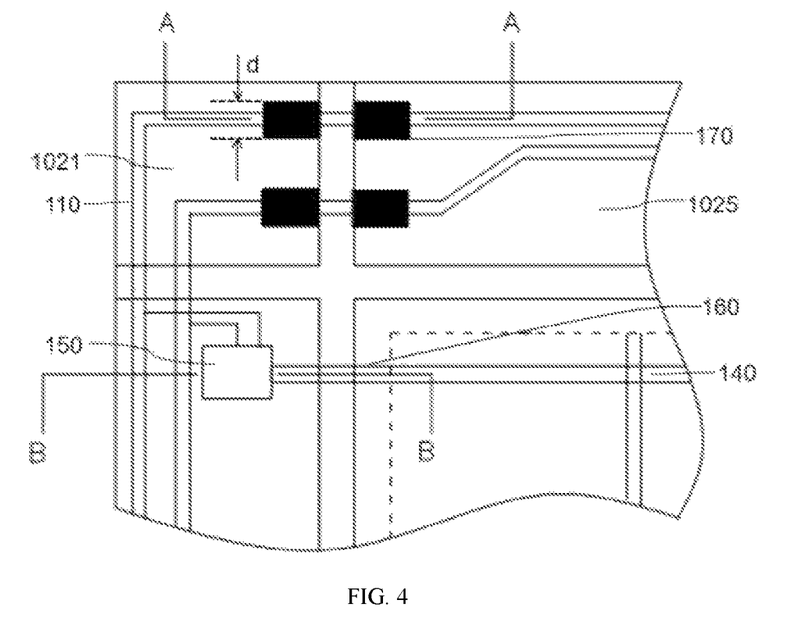
FIG. 4 is a first partial enlarged view of the array substrate of FIG. 1.
Figure 5:
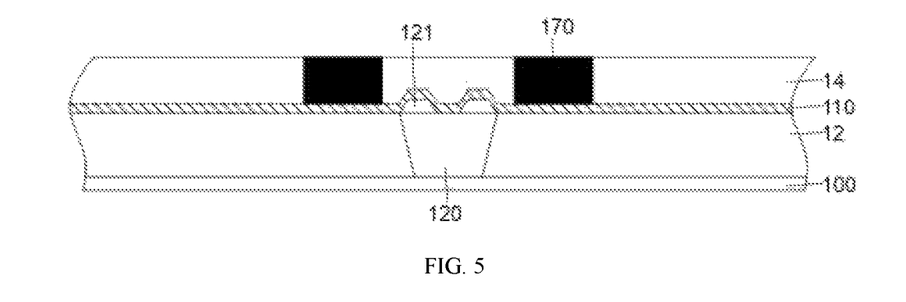
FIG. 5 is a cross-sectional view of the array substrate of FIG. 4 taken along the line A-A.

Referring to FIG. 4 and FIG. 5, FIG. 4 is a first partial enlarged view of the array substrate of FIG. 1, and FIG. 5 is a cross-sectional view of FIG. 4 taken along the line A-A. As shown in FIG. 4, the array substrate further includes at least one conductive pad 170 disposed on the peripheral trace 110 on both sides of the bending pathway 120a. The conductive pad 170 is an organic conductive layer, and the width d of the conductive pad 170 in a direction perpendicular to the longitudinal peripheral trace 110 is greater than the width of the peripheral trace 110. For example, the width d of the conductive pad along a direction perpendicular to the longitudinal axis of the peripheral trace 110 is 2-10 times of a width of the peripheral trace 110. In order to adapt the width of the conductive pad 170 to be larger than the width of the peripheral trace 110, the spacing of the adjacent two peripheral traces 110 is correspondingly increased in the first corner 1021, and the distance between the adjacent two peripheral traces 110 is gradually small from the entrance of the first main trace segment 1025. The conductive pad 170 is formed in the second insulation layer 14 and is located on the peripheral trace 110. The second insulation layer 14 is the second insulation layer in the non-display zone 102a'. The thickness of the conductive pad 170 is the same as the thickness of the second insulation layer 14. It can be understood that the conductive pad 170 can also be located on the peripheral trace 110 above the bending pathway 120a.

In addition, the array substrate further includes an organic insulating elastic layer 120, and the organic insulating elastic layer 120 is disposed in the bending pathway 120a. When the array substrate folded along the bending pathway 120a, the organic insulating elastic layer 120 is resilient so that it provides the lengthening required for bending during the folding process. Material of the organic insulating elastic layer 120 is a rubber material, such as ethylene propylene diene monomer rubber or natural rubber. The bending pathway 120a is formed in the channel of the first insulation layer 12, and forms an organic insulating elastic layer 120 in the bending pathway 120a in the first insulation layer 12 before forming the source and drain electrodes of the thin film transistor in the display zone 102a. The first insulation layer 12 is the first insulation layer in the non-display zone 102a'.

Further, a surface of the organic insulating elastic layer 120 in contact with the peripheral trace 110 is provided with an organic insulating elastic protrusion 121, which is deformed to further provide the lengthening required for the organic insulating elastic layer 120 when the organic insulating elastic protrusion 121 is folded. Moreover, the peripheral trace 110 overlying the organic insulating elastic protrusion 121 is also deformed to provide the lengthening required for the peripheral trace 120 to be bent when the peripheral trace 110 is folded. Therefore, the organic insulating elastic protrusion 121 on the organic insulating elastic layer 120 can prevent the peripheral trace 120 from breaking when folded. The organic insulating elastic protrusion 121 and the organic insulating elastic layer 120 can be produced by the same process or by different processes. The organic insulating elastic protrusion 121 may be a hemispherical, trapezoid, stepped, or toothed shape. It can be understood that the surface of the organic insulating elastic layer 120 in contact with the peripheral trace 110 can also be provided with at least one groove so that the peripheral trace 110 is also deformed to provide the lengthening required for the peripheral trace 110 to be bend when the peripheral trace 110 is folded.

Figure 6:
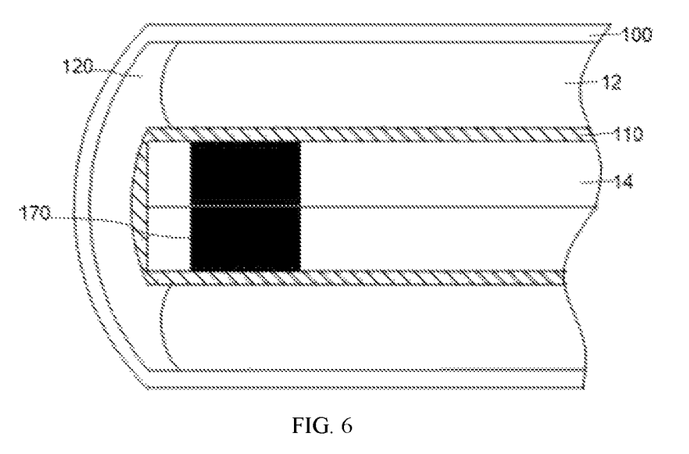
FIG. 6 is a schematic cross-sectional view of the array substrate shown in FIG. 5 folded along a bending pathway.

Referring to FIG. 6, FIG. 6 is a schematic cross-sectional view of the array substrate shown in FIG. 5 folded along the bending pathway. The organic insulating elastic protrusion 121 is deformed after stretching so that the peripheral trace 110 is also deformed, thereby to avoid the breakage of the peripheral trace 110 during stretching. The conductive pads 170 on the peripheral trace 110 on both sides of the bending pathway 120a are in contact with each other to further ensure that the peripheral traces on both sides of the bending pathway 120a can be electrically connected.

Figure 7:
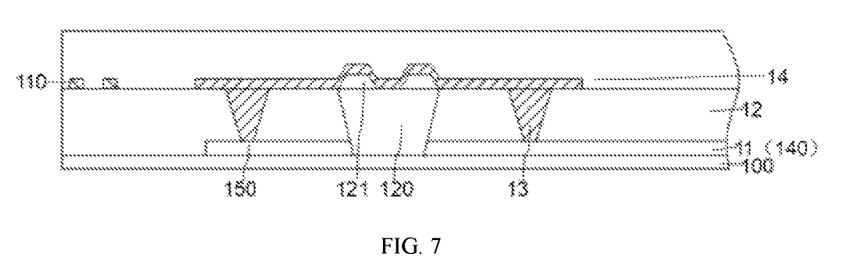
FIG. 7 is a cross-sectional view of the array substrate of FIG. 4 taken along the line B-B.

Referring to FIG. 4 and FIG. 7, FIG. 7 is a cross-sectional view of FIG. 4 taken along line B-B. The scan line 140 in the display zone 102a is connected to the gate driving circuitry 150 located in the trace segment by the transition trace 160. The second conductive layer 13 is electrically connected to the gate driving circuitry 150 and the first conductive layer 11 by the through via in the first insulation layer 12. When the second conductive layer 13 extends to the bending pathway 120a, the second conductive layer 13 is located on the surface of the organic insulating elastic layer 120. The surface of the organic insulating elastic layer 120 in contact with the second conductive layer 13 is provided with an organic insulating elastic protrusion 121 which is deformed to further provide the lengthening required for the bending of the organic insulating elastic layer 120 when folded. Moreover, the second conductive layer 13 overlying the organic insulating elastic protrusion 121 is also deformed to provide the lengthening required for the second conductive layer 13 to be bend during folding.

As shown in FIG. 7, the transition trace 160 includes the first conductive layer 11, the first insulation layer 12, and the second conductive layer 13 which are sequentially disposed on the first surface 102 of the flexible substrate 100. Specifically, the first conductive layer 11 is a scan line 140 extending from the display zone 102a to the line transition segment 160a, the first insulation layer 12 is the first insulation layer in the non-display zone 102a', and the second conductive layer 13 is the second conductive layer in the non-display zone 102a'. A surface of the second conductive layer 13 also covered by the second insulation layer 14, which is the second insulation layer in the non-display zone 102a'.

Figure 8:
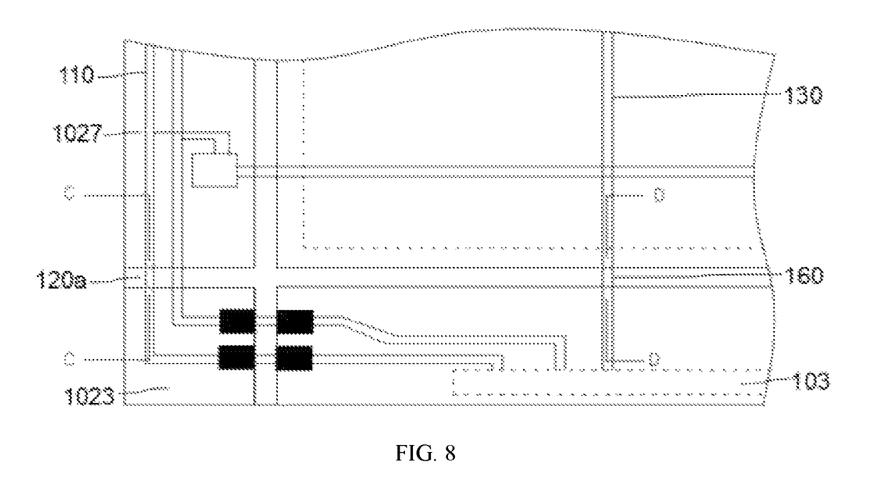
FIG. 8 is a second partial enlarged view of the array substrate of FIG. 1.
Figure 9:
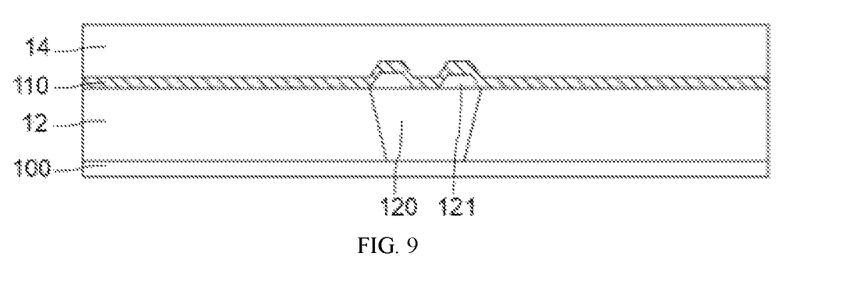
FIG. 9 is a cross-sectional view of the array substrate of FIG. 8 taken along the line C-C.

Referring to FIG. 8 and FIG. 9, FIG. 8 is a second partial enlarged view of the array substrate of FIG. 1, and FIG. 9 is a cross-sectional view of the array substrate of FIG. 8 taken along the line C-C. The peripheral trace 110 extends directly from the third main trace segment 1027 to the third corner 1023, and the surface of the organic insulating elastic layer 120 in contact with the peripheral trace 110 is provided with the organic insulating elastic protrusion 121, so that the peripheral trace 110 can be elongated to avoid breakage during the folding process.

Figure 10:
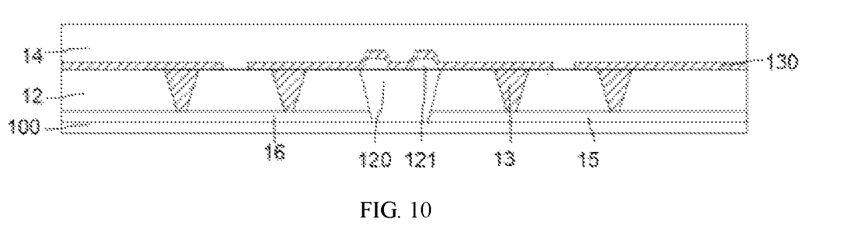
FIG. 10 is a cross-sectional view of the array substrate of FIG. 8 taken along the line D-D.

Referring to FIG. 8 and FIG. 10, FIG. 10 is a cross-sectional view of the array substrate of FIG. 8 taken along the line D-D. The data line 130 extends through the bending pathway 120a to the bonding area 103, and the data line 130 needs the transition trace 160 to change the line before passing through the bending pathway 120a. Specifically, the data line 130 is connected to the first transition pad 15 by the through via on the first insulation layer 12. The second conductive layer 13 extending from the line transition segment 160a to the trace segment is electrically connected to the first transition pad 15 and the second transition pad 16 by the through via on the first insulation layer 12. After the second conductive pad 16 is connected to the second conductive layer 13 of the trace segment by the through via in the first insulation layer 12, the second conductive layer 13 of the trace segment extends to the bonding area 103. The first transition pad 15 is located in the line transition segment 160a, the second transition pad 16 is located in the trace segment, and the first transition pad 15 and the second transition pad 16 are both formed by patterning the first conductive layer 11 outside the display zone 102a. In addition, the surface of the organic insulating elastic layer 120 in contact with the second conductive layer 13 is provided with the organic insulating elastic protrusion 121 so that the second conductive layer 13 can be elongated to avoid breakage during folding.

Another object of the present application is to provide a display panel including the above array substrate.

Further, the display panel further includes an anode, a light emitting layer, and a cathode which are sequentially formed on the array substrate.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising:
   a flexible substrate comprising a first surface and a second surface opposite to the first surface, wherein the first surface of the flexible substrate comprises a display zone and a non-display zone, and the non-display zone is located at a periphery of the display zone;
   a peripheral trace disposed on a trace segment of the non-display zone;
   a bending pathway disposed between the trace segment and the display zone; and
   an organic insulating elastic layer disposed on the bending pathway;
   wherein the array substrate is folded along the bending pathway to cause the peripheral trace located at a side of the second surface of the flexible substrate; and
   wherein an organic insulating elastic protrusion is disposed on a contact surface between the organic insulating elastic layer and the peripheral trace.

2. The array substrate according to claim 1, wherein the array substrate further comprises a transition trace disposed on a line transition segment, and the line transition segment is located between the bending pathway and the display zone.

3. The array substrate according to claim 2, wherein the transition trace comprises a first conductive layer, a first insulation layer, and a second conductive layer which are sequentially disposed on the first surface of the flexible substrate.

4. The array substrate according to claim 3, wherein the array substrate further comprises a gate driving circuitry disposed on the trace segment, and the array substrate is folded along the bending pathway to have the gate driving circuitry located at the side of the second surface of the flexible substrate.

5. The array substrate according to claim 4, wherein the second conductive layer is electrically connected to the gate driving circuitry and the first conductive layer through at least one through via in the first insulation layer.

6. The array substrate according to claim 5, wherein the first conductive layer is a scan line extending from the display zone to the line transition segment.

7. The array substrate according to claim 2, wherein a width of the line transition segment is in a range of 0.08 mm to 0.12 mm.

8. The array substrate according to claim 7, wherein the width of the line transition segment is 0.1 mm.

9. The array substrate according to claim 1, wherein the organic insulating elastic protrusion has a hemispherical, trapezoid, stepped, or toothed shape.

10. The array substrate according to claim 1, wherein the array substrate further comprises conductive pads disposed on the peripheral trace on both sides of the bending pathway.

11. The array substrate according to claim 10, wherein the conductive pads are organic conductive pads.

12. The array substrate according to claim 10, wherein a width of any of the conductive pads along a direction perpendicular to the longitudinal axis of the peripheral trace is 2-10 times of a width of the peripheral trace.

13. The array substrate according to claim 1, wherein the array substrate further comprises an external control chip bonded on a bonding area of the trace segment, and the array substrate is folded along the bending pathway to have the external control chip located at the side of the second surface of the flexible substrate.

14. The array substrate according to claim 1, wherein the bending pathway is arranged in a shape of a meshed grid.

15. A display panel, comprising an array substrate, the array substrate comprising:
a flexible substrate comprising a first surface and a second surface opposite to the first surface, wherein the first surface of the flexible substrate comprises a display zone and a non-display zone, the non-display zone is located at a periphery of the display zone;
a peripheral trace disposed on a trace segment of the non-display zone;
a bending pathway disposed between the trace segment and the display zone; and
an organic insulating elastic layer disposed on the bending pathway;
wherein the array substrate is folded along the bending pathway to cause the peripheral trace located at a side of the second surface of the flexible substrate; and
wherein an organic insulating elastic protrusion is disposed on a contact surface between the organic insulating elastic layer and the peripheral trace.

16. The display panel according to claim 15, wherein the array substrate further comprises a gate driving circuitry disposed on the trace segment, and the array substrate is folded along the bending pathway to have the gate driving circuitry located at the side of the second surface of the flexible substrate.

17. The display panel according to claim 15, wherein the array substrate further comprises an external control chip bonded on a bonding area of the trace segment, and the array substrate is folded along the bending pathway to have the external control chip located at the side of the second surface of the flexible substrate.

* * * * *